US006760572B2

United States Patent
Noori

(10) Patent No.: US 6,760,572 B2
(45) Date of Patent: Jul. 6, 2004

(54) METHOD AND APPARATUS FOR COMBINING TWO AC WAVEFORMS

(75) Inventor: Basim Noori, San Jose, CA (US)

(73) Assignee: Tropian, Inc., Cupertino, CA (US)

( * ) Notice: Subject to any disclaimer, the term of this patent is extended or adjusted under 35 U.S.C. 154(b) by 0 days.

(21) Appl. No.: 10/115,298

(22) Filed: Apr. 2, 2002

(65) Prior Publication Data

US 2003/0186656 A1 Oct. 2, 2003

(51) Int. Cl.[7] .......................... H04B 17/02; H01P 5/22
(52) U.S. Cl. .................. 455/137; 455/139; 455/106; 333/117; 333/121; 333/125; 333/1.1
(58) Field of Search ................. 455/91, 108, 273, 455/60, 78, 81, 82, 106, 137, 132, 139; 333/1.1, 121, 124, 109, 24.1, 115, 117, 125, 127, 128, 136

(56) References Cited

U.S. PATENT DOCUMENTS

| | | | | | |
|---|---|---|---|---|---|
| 3,748,600 | A | * | 7/1973 | Fisher et al. ............... | 455/139 |
| 4,373,207 | A | * | 2/1983 | Hecken ...................... | 455/139 |
| 4,451,832 | A | * | 5/1984 | Stites ........................ | 343/858 |
| 5,504,465 | A | * | 4/1996 | Yung et al. ................. | 332/145 |
| 5,895,775 | A | * | 4/1999 | Shiau ......................... | 505/210 |
| 6,108,313 | A | * | 8/2000 | Lee et al. ................... | 370/294 |
| 6,121,853 | A | * | 9/2000 | London ...................... | 333/125 |
| 6,313,713 | B1 | * | 11/2001 | Ho et al. .................... | 333/1.1 |
| 6,507,253 | B1 | * | 1/2003 | Matsuyoshi et al. ........ | 333/156 |

* cited by examiner

*Primary Examiner*—Duc M. Nguyen
(74) *Attorney, Agent, or Firm*—Thelen Reid & Priest LLP

(57) ABSTRACT

Two fixed-phase-related signals of arbitrary (unequal) magnitude are combined without incurring combining loss by use of a signal reflection technique wherein the higher magnitude signal is phase-synchronously reinforced along its path through the combining system. In a specific embodiment, two signal sources are fed as equal phase signals through respective counter-rotating circulators to a four-port first combiner, wherein the first output port of the combiner is provided with a one-eighth wavelength phase delay to a termination and the second output port is directly terminated, so that reflected signals as seen at both input ports return exactly in phase and of equal magnitude to one another. Thereupon the reflected signals are directed by the respective circulators as phase-synchronized signals to a second combiner which combines the phase synchronized signals into a common output signal. The resultant output is the sum of the inputs irrespective of relative magnitudes of the inputs.

21 Claims, 1 Drawing Sheet

METHOD AND APPARATUS FOR COMBINING TWO AC WAVEFORMS

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

This invention relates to analog signal propagation techniques. More particularly this invention relates to methods for combining signals of a common frequency and fixed phase relationship in the microwave and optical frequency ranges so that there is minimal efficiency loss. Applications include signal combiners for rf wireless transmission.

In conventional signal combining schemes, such as the use of an in-phase Wilkinson combiner technique or a branch-line combiner, considerable signal loss is incurred when two or more signals of vastly unequal amplitude are combined. For example, in a conventional combiner, there is presumed to be an inherent half power loss when only one branch of a two-input device is active.

What is needed is a three port, two-input signal combiner which propagates signals from one input terminal to an output terminal without inherent loss, whether or not another signal of the same frequency and phase is present at the other input terminal.

SUMMARY OF THE INVENTION

According to the invention, two fixed-phase-related signals which are of the same or harmonically-related frequencies but arbitrary (unequal) magnitude are combined without incurring combining loss by use of a signal reflection technique wherein the higher magnitude signal is phase-synchronously reinforced along its path through the combining system. In a specific embodiment employing a conventional four-port branch-line combiner (wherein one input port has a one-quarter wavelength path and a three-quarter wavelength path to a common output port), two signal sources of the same frequency and of a fixed equal phase relationship but arbitrary magnitude are fed as equal phase signals through respective counter-rotating circulators to the combiner, wherein the first output port of the combiner is provided with a one-eighth wavelength phase delay to a short or open (100% reflection) and the second output port is also terminated in a short or open (100% reflection), so that reflected signals as seen at both input ports return exactly in phase and of equal magnitude to one another. Thereupon the reflected signals are directed by the respective circulators as phase-synchronized signals to a second combiner which combines the phase synchronized signals into a common output signal. The second combiner may of the Wilkinson-type or of a branch-line type with a quarter-wave delay on one input branch. The invention can be implemented with microwave components for microwave frequencies or with optical components for optical frequencies.

The invention will be better understood upon reference to the following detailed description and accompanying drawings.

DETAILED DESCRIPTION OF SPECIFIC EMBODIMENTS OF THE INVENTION

Figure 1:
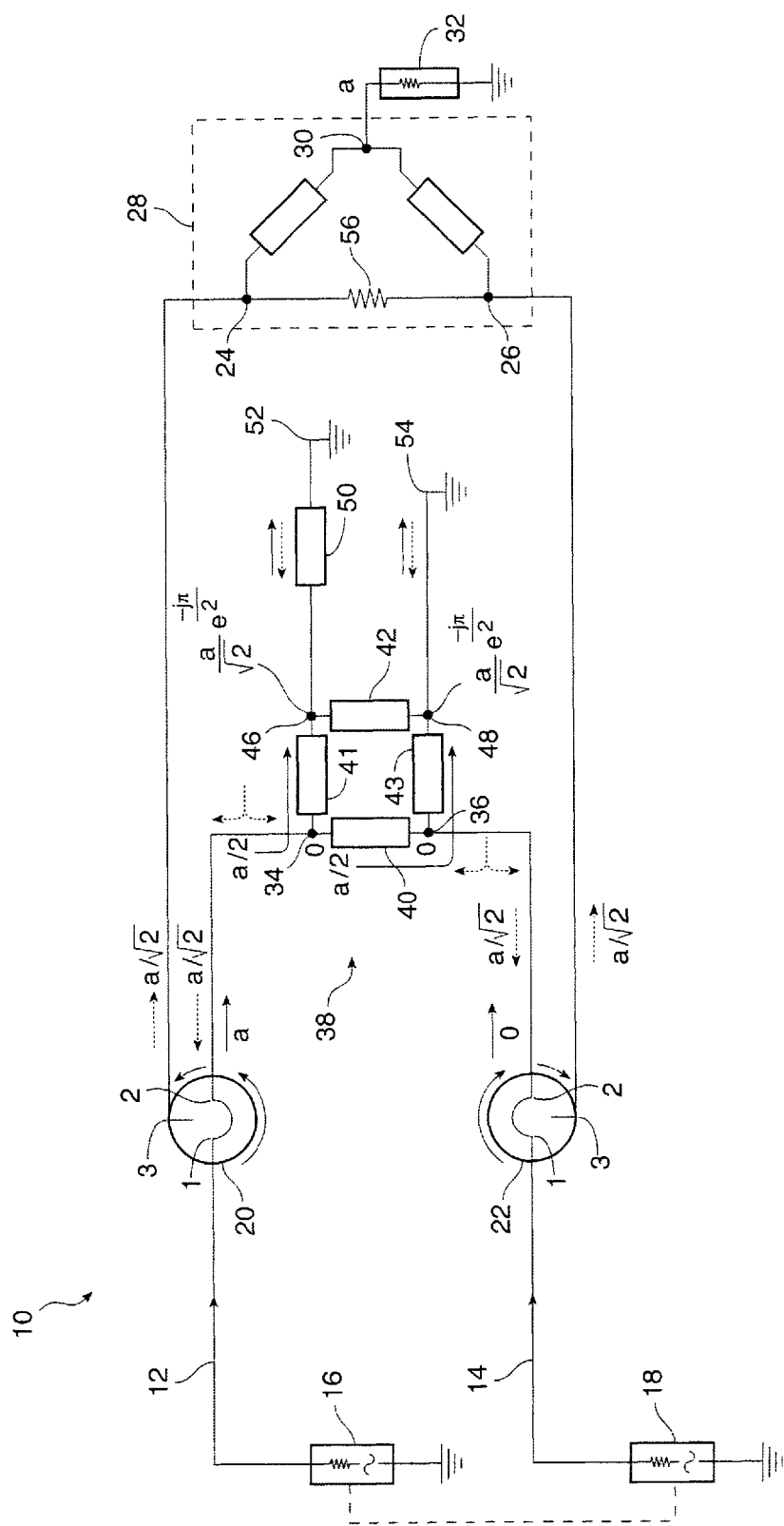
FIG. 1 is a circuit diagram of a signal combiner according to the invention.

Referring to FIG. 1, there is shown a circuit diagram of a signal combiner system 10 which implements the method according to the invention. For the purposes of analysis and simplification, it is assumed that all transmission lines, delay components and circulator components and combiner components are lossless, which is a reasonable assumption. Input system ports 12 and 14 are fed from signal sources 16 and 18, which produce signals which are related to one another in that they are of the same frequency and in fixed-phase-relationship to one another. To assure that the magnitudes of the input signals are preserved, the input signals are in phase with one another. The system input signal ports 12, 14 are coupled to first ports of first and second three-port circulators 20, 22. The circulators 20, 22 are configured to be counterrotating to one another so that signals received from the second port in each device 20, 22 are always redirected to the third ports and are never directed to the system input ports 12, 14. The third ports of the circulators 20, 22 are each coupled to one of two input ports 24, 26 of a three port output combiner 28. The third port 30 is an output coupled to a matching (nonreflective) load 32, such as an antenna, if the combiner system 10 according to the invention is used for transmitting combined signals.

The second ports 2 of the circulators 20, 22 are coupled to respective first and second inputs 34, 36 of a four-port combiner 38. The combiner 38 may comprise a set of quarter-wavelength delay elements 40–43 coupled together in a ring with ports 34, 36, 46, 48 at the nodes between delay elements 40–43. One output port 46 is coupled to a delay element 50, which provides a one-eighth wavelength delay, and which is connected to a short circuit of corresponding open circuit termination 52 to assure full reflection of incident signals. Hence reflected signals at the output port 46 are delayed by one-quarter wavelength relative to incident signals.

The other output port 48 is terminated directly either in a short circuit or open circuit termination 54. The terminations 52 and 54 should be of the same sense so that the phase transformation upon reflection at the termination is the same for each.

The combiner 38 is called a branch-line combiner. The combiner 28 can be a Wilkinson-type three port combiner with an isolation resistance 56 between its input ports or a four-port branch-line combiner (like combiner 38) with a load-matching termination (not shown) at one output port and the load 32 at the other output port.

The operation of the combiner system 10 and the method according to the invention is illustrated by an example in which a first input signal $v_{i1}$ at port 1 of first circulator 20 is a constant $\alpha$ and the second input $v_{i2}$ at port 1 of second circulator 22 is set to zero. The magnitude of the input signal at the first input port 34 of the combiner 38 is α while the magnitude of the input signal at the second input port 36 is 0. The eighth wave section 50 provides a quarter wave phase delay upon signal reflection as seen at output port 46. An analysis will show that the signals at the first output port 46 and the second output port 48 will have the magnitude and phase given by the expressions:

$$v_{f1} = \frac{a}{\sqrt{2}} e^{-j\frac{\pi}{2}} \quad (1)$$

$$v_{f2} = \frac{a}{\sqrt{2}} e^{-j\pi} \quad (2)$$

Due to phase cancellation effects, no signals will traverse the delay coupling between input ports 34 and 35 and the signals reflected to the circulators 20 and 22 will be of equal magnitude and phase, no matter what the magnitude of the input signals. The signals are redirected from the circulators 20 and 22 to the input ports 24, 26 of the three-port combiner 28, where they are combined to produce an output of magnitude equal to the sum (or difference, depending upon relative phase) of the input signals. Hence, there is no combiner loss due to the presence of a combiner system between the input and the output.

In other embodiments, the combiner 38 may be of any of various different types. Depending on the type of combiner, the desired phase relationship between the input signals to the combiner may differ. The desired phase relationship will govern selection of an appropriate delay element 50 for use with the combiner 38. For example, if the desired relationship is to have the input signals to the combiner 28 be in phase, then the delay element 50 may be omitted.

The invention have been explained with respect to specific embodiments. Other embodiments will be evident to those of ordinary skill in the art. It is therefore not intended that this invention be limited, except as indicated by the appended claims.

What is claimed is:

1. A method for combining first and second fixed-phase-related input signals without incurring combining loss, said first and second fixed-phase-related signals being of a common or harmonically-related frequency and of arbitrary magnitude relationship comprising:

combining said first and second input signals in-phase in a first four-port combiner having at least first and second input ports and at least first and second output ports;

reflecting back to both said first and second input ports from both said first output port and said second output port said fixed-phase-related signals while introducing a quadrature phase differential in all signals reflected from only one of said first and second output ports to produce first and second reflected signals; thereupon redirecting said first and second reflected signals to a second combiner; and combining signals from said redirecting step to produce a combined signal such that the magnitude of the combined signal is a constant sum corresponding to the maximum magnitude of one of the following:

said first input signal;

the sum of said first input signal and said second input signal.

2. The method according to claim 1 wherein the redirecting step employs a first circulator and a second circulator, said first circulator being deployed between a first system input and said first input port of said first combiner, and said second circulator being deployed between a second system input and said second input port of said first combiner, said first circulator being counterrotating relative to said second circulator.

3. The method according to claim 2 wherein:

said first circulator has a first port coupled to said first system input port, a second port coupled to said first combiner first input port, and a third port coupled to said second combiner first input port; and wherein said second circulator has a first port coupled to said second system input port, a second port coupled to said first combiner second input port, and a third port coupled to said second combiner second input port.

4. The method according to claim 2 wherein said first combiner is a four-port branch-line combiner, wherein each input port has a one-quarter wavelength path and a three-quarter wavelength path to a common output port.

5. The method according to claim 2 wherein said first output port of said first combiner is provided with a one-eighth wavelength phase delay to a short for 100% reflection and said second output port is directly terminated in a short for 100% reflection so that reflected signals as seen at both said first and second input ports of said first combiner return in phase and of equal magnitude to one another.

6. The method according to claim 2 wherein said first output port of said first combiner is provided with a one-eighth wavelength phase delay to an open for 100% reflection and said second output port is directly terminated in an open for 100% reflection so that reflected signals as seen at both said first and second input ports of said first combiner return in phase and of equal magnitude to one another.

7. The method according to claim 1 wherein said quadrature phase differential is implemented by passing a signal forward and reflected through a one-eighth wavelength delay.

8. An apparatus for combining first and second fixed-phase-related input signals without incurring combining loss, said first and second fixed-phase-related signals being of a common or harmonically-related frequency and of arbitrary magnitude relationship comprising:

a first four-port combiner having at least first and second input ports and at least first and second output ports;

a phase delay element in an output path of one of said first and second combiner output ports;

terminations for said first and second output ports for reflecting back to both said first and second input ports from both said first output port and said second output port while introducing a quadrature phase differential in all signals reflected from only one of said first and second output ports to produce first and second reflected signals;

a second combiner having first and second input ports and at least a first output port; and a first circulator and a second circulator, said first circulator being deployed between a first system input and said first input port of said first combiner, and said second circulator being deployed between a second system input and said second input port of said first combiner, said first circulator being counterrotating relative to said second circulator.

9. The apparatus according to claim 8 wherein:

said first circulator has a first port coupled to said first system input port, a second port coupled to said first combiner first input port, and a third port coupled to said second combiner first input port; and wherein said second circulator has a first port coupled to said second system input port, a second port coupled to said first combiner second input port, and a third port coupled to said second combiner second input port.

10. The apparatus according to claim 8 wherein said first combiner is a four-port branch-line combiner, wherein each input port has a one-quarter wavelength path and a three-quarter wavelength path to a common output port.

11. The apparatus according to claim 8 wherein said phase delay element has a one-eighth wavelength delay in each direction through said element.

12. A method of efficiently combining high-frequency signals of a given frequency over a wide range of relative signal powers, comprising:

using at least a first combiner, reflecting the high-frequency signals to form reflected high-frequency signals of substantially equal power; and using at least a second combiner, combining the reflected high-frequency signals to form an output signal.

13. The method of claim 12 wherein said first combiner has two input ports and two output ports.

14. The method of claim 12 wherein said first combiner comprises a set of quarter-wavelength delay elements disposed in a ring configuration, nodes between delay elements embodying input and output ports of the first combiner.

15. The method of claim 14 wherein a one-eighth wavelength delay element is coupled to one of the output ports of the first combiner.

16. The method of claim 12 wherein said first combiner comprises a branch-line combiner.

17. Circuitry for efficiently combining high-frequency signals of a given frequency over a wide range of relative signal powers, comprising:

at least a first combiner for reflecting the high-frequency signals to form reflected high-frequency signals of substantially equal power; and at least a second combiner for combining the reflected high-frequency signals to form an output signal.

18. The circuitry of claim 17 wherein said first combiner has two input ports and two output ports.

19. The circuitry of claim 17 wherein said first combiner comprises a set of quarter-wavelength delay elements disposed in a ring configuration, nodes between delay elements embodying input and output ports of the first combiner.

20. The circuitry of claim 19 wherein a one-eighth wavelength delay element is coupled to one of the output ports of the first combiner.

21. The circuitry of claim 17 wherein said first combiner comprises a branch-line combiner.

* * * * *

UNITED STATES PATENT AND TRADEMARK OFFICE
CERTIFICATE OF CORRECTION

PATENT NO.   : 6,760,572 B2
DATED        : July 6, 2004
INVENTOR(S)  : Basim Noori It is certified that error appears in the above-identified patent and that said Letters Patent is hereby corrected as shown below:

Column 3,
Line 61, after "said first imput signal;" insert -- said second input signal; and --.

Signed and Sealed this

Fifteenth Day of February, 2005

JON W. DUDAS
*Director of the United States Patent and Trademark Office*